United States Patent
Tuominen et al.

(10) Patent No.: US 6,248,696 B1
(45) Date of Patent: Jun. 19, 2001

(54) 7-FORMING, SUPERCONDUCTING FILAMENTS THROUGH BICOMPONENT DRY SPINNING

(75) Inventors: Olli P. Tuominen, Ogden, UT (US); Carol W. Morgan, Asheville, NC (US); Dominick A. Burlone, Asheville, NC (US); Keith V. Blankenship, Asheville, NC (US)

(73) Assignee: BASF Corporation, RTP, NC (US)

( * ) Notice: Subject to any disclaimer, the term of this patent is extended or adjusted under 35 U.S.C. 154(b) by 0 days.

(21) Appl. No.: 08/275,864

(22) Filed: Jul. 15, 1994

(51) Int. Cl.$^7$ .................. B28B 3/20; H01L 39/00
(52) U.S. Cl. ............. 505/430; 264/639; 264/211.11
(58) Field of Search ................. 264/63, 211.11, 264/638, 639, 640; 505/430, 434

(56) References Cited

U.S. PATENT DOCUMENTS

| | | | |
|---|---|---|---|
| 2,428,046 | 9/1947 | Sisson et al. .................. 28/82 |
| 4,166,147 | 8/1979 | Lange et al. .................. 428/328 |
| 4,207,226 | 6/1980 | Storm .......................... 260/38 |
| 4,250,131 | 2/1981 | Sobel et al. .................. 264/56 |
| 4,342,712 | 8/1982 | Yajima et al. ................. 264/63 |
| 4,559,191 | 12/1985 | Arons ......................... 264/60 |
| 4,863,799 | 9/1989 | Mininni et al. ................ 428/373 |
| 4,988,671 | 1/1991 | Johnson ....................... 505/1 |
| 5,006,504 | 4/1991 | O'Brien ....................... 505/1 |
| 5,023,231 | 6/1991 | Hsu ............................ 505/1 |
| 5,037,801 | * 8/1991 | Kloucek ....................... 505/1 |
| 5,112,801 | 5/1992 | Nellis et al. .................. 505/1 |
| 5,166,130 | 11/1992 | Enomoto et al. ................ 505/1 |
| 5,356,869 | * 10/1994 | Capone et al. ................. 505/430 |

FOREIGN PATENT DOCUMENTS

| | | |
|---|---|---|
| 633357 | 12/1963 | (BE) . |
| 8703412 | 1/1989 | (BR) . |
| 0358543 | 12/1987 | (EP) . |
| 0384785 | 8/1990 | (EP) . |
| 0401014 | 12/1990 | (EP) . |
| 0456150 | 11/1991 | (EP) . |
| 6419612 | 1/1989 | (JP) . |
| 01122511 | 5/1989 | (JP) . |
| 01122512 | 5/1989 | (JP) . |
| 1122521 | 5/1989 | (JP) . |
| 01176606 | 7/1989 | (JP) . |

OTHER PUBLICATIONS

R. Flukiger et al., "Processing of Classical and High Tc Superconducting Wires", *Applied Superconductivity*, vol. 1, Nos. 3–6, pp. 709–723.

Ulhnanns Encyklopadie der technischen Chemie 4. Auflage, Band 19, pp. 385–386.

(List continued on next page.)

*Primary Examiner*—Christopher A. Fiorilla
(74) *Attorney, Agent, or Firm*—K. M. Dellerman

(57) ABSTRACT

Fibers which contain potentially superconducting material are dry spun by the steps of preparing a suspension of potentially superconducting powder in a thickened solvent; preparing a solution of fiber-forming polymer; supplying the suspension and the solution to a spinning apparatus; in the spinning apparatus, arranging the solution and the suspension in a bicomponent arrangement; extruding the arranged solution and suspension from a spinneret as a bicomponent filament; and removing the solvent from the filament.

10 Claims, 3 Drawing Sheets

OTHER PUBLICATIONS

Prof. Vieweg et al., Polyacetale–4, Epoxidharze, fluorhaltige Polymerisate, Silicone usw., *Kunststoff–Handbuch*, Band XI, Carol Hanser Verlag, Munchen, pp. 558–569.

Nunez–Regueliro et al., "Pressure–Induced Enhandement of Tc Above 150K in Hg–1223", *Science Magazine*, vol. 262, Oct. 1, 1993, pp. 97–99.

Amato, "High TcSuperconductors Get Squeezed", *Science Magazine*, vol. 262, Oct. 1, 1993, p. 31.

Amato, "Finally a Hotter Superconductor", *Science Magazine*, vol. 260, May 7, 1993, p. 755.

"Critical Temperature Nears 135K in a Mercury–Based Superconductor", *Physics Today*, Jul. 1993, pp. 20–23.

McDevitt et al., "Electrochemistry of High–Temperature Superconductors Challenges and Opportunities", *Analytical Chemisty*, vol. 65, No. 11, Jun. 1, 1993, pp. 535–545.

McWilliams, "Superconductors Run into Resistance", *Business Week*, Apr. 12, 1993, pp. 90–91.

Amato, "Theory Meets Experiment in High–T Superconductivity", *Science Magazine*, vol. 261, Jul. 16, 1993, p. 294.

Wolsky et al., "The New Superconductors: Prospects for Applications", *Scientific American*, Feb. 1989, pp. 60–69.

Chen et al., "Characteristics and Design Procedure for Hyperbolic Dies", *J. of Polymer Science: Part B: Polymer Physics*, vol. 30, 1992, pp. 557–561.

Cogswell, "Converging Flow of Polymer Melts in Extrusion Dies", *Polymer Engineering Science*, vol. 12, Jan. 1972, pp. 64–73.

Ihm et al., "A Visualization Study of Polyethylene Terephthalate Flow Using a Pseudohyperbolic Die Geometry", *J. of Polymer Science: Part B: Polymer Physics*, vol. 25, pp. 619–640 (1987).

Goto, "Critical Current Density of $Ba_2Y_1 CU_3O_{7-x}$ Superconducting Filaments Produced by Various Suspension Spinning Conditions", *J. Materl. Res 3*, (6), Nov./Dec. 1988, pp. 1292–1296.

Zhang, "Characteristics of the Aqueous Solution of Carboxymethyl Starch Ether", *Journal of Applied Polymer Science*, vol. 46, 1992, pp. 369–374.

Dagani, "Polymer Film Effect is Basis of Molecular Switch", *C&EN*, Feb. 22, 1993, pp. 24–25.

Sudduth, "A New Method to Predict the Maximum Packing Fraction and the Viscosity of Solutions with a Size Distribution of Suspended Particles", Part 11, *Journal of Applied Polymer Science*, vol. 48, pp. 37–55.

Sudduth, "A Generalized Model to Predict the Viscosity of Solutions with Suspended Particles", Part 1, *Journal of Applied Polymer Science*, vol. 48, pp. 25–36.

Kawai et al., "Higher Temperatures for Superconductors?" Report by D. P. Hamilton in *Science Scope*, vol. 256, Apr. 17, 1992, p. 299.

Cava, "Superconductors Beyond 1–2–3", *Scientific American*, Aug. 1990, pp. 42–49.

Miyashiro, *Hybrid Circuits No. 19*, May 1989, pp. 19–22.

Wu et al., "Superconductivity at 93K in a New Mixed Phase Y–Ba–Cu–O Compound System at Ambient Pressure", *Physical Review Letters*, vol. 58, 1987, pp. 908–910.

Buhler, *Kollidon Polyvinylpyrrolidone for the pharmaceutical industry*, BASF Product Information, Aug. 1993, 2nd edition, pp. 116, 120, 175–182.

Barten, H. et al., "Inventory of Possible Electrical–Power Applications of High–Tc Superconductors", *Kema Scientific and Technical Reports*, vol. 7, 1989, pp. 201–226.

Wizon and Robertson, "Continuous Filament Ceramic Fibers via the Viscose Process", Journal of Polymer Science: Part C, No. 19, pp. 267–281.

Cass, R.B., "Fabrication of Continous Ceramic Fiber by the Viscous Suspension Spinning Process", *Ceramic Bulletin*, vol. 70, No. 3, 1991, pp. 424–429.

Catania, Hovnanian, Cot, "Superconducting $YBA_2Cu_3O_{7-x}$ Fibers From Aqueous Acetate/PAA and Nitrate/PAA Gels", *Mat. Res. Bull.*, vol. 25, 1990, pp. 1477–1485.

Goto, Sugishita and Kojima, "A New Fabrication Process of $Y_1Ba_2Cu_4O_8$ Superconducting Filament by Solution Spinning Method Under Ambient Pressure", *Physica*, C171, 1990, pp. 441–443.

Goto, "Nonaqueous Suspension Spinning of High–Tc Ba–Y– Cu–O Superconductor", *Japanese Journal of Applied Physics*, vol. 27, No, 4, Apr., 1988, pp. L680–L682.

News Release, "Argonne and BASF Improving Superconductin Wire", Argonne, Illionois, Oct. 20, 1992.

Adrian, Cowan, "The New Superconductors", *C&EN*, Dec. 21, 1992, pp. 24–41.

Taubes, "Holding the Lines in High–Temperature Superconductors", vol. 261, Sep. 17, 1993, pp. 1521–1522.

Goto, "Fine Y–Ba–Cu–O Superconducting Filaments Produced by Suspension Spinning Method", *Physica C*, 1989, pp. 558–559.

Billmeyer, Jr., "Regenerated Cellulose", *Textbook of Polymer Science*, 2nd ed., 1971, pp. 445–447.

Ginley, Venturini, Kwak, Mitchell, Morosin, Baughman, "Rapid Thermal Processing of $YBa_2Cu_3O_7$ Spun Wires", *J. Appl. Phys* 67, May 15, 1990, pp. 6382–6388.

Japan New Materials Report, Sep.–Oct. 1993, pp 9–12.

* cited by examiner

7-FORMING, SUPERCONDUCTING FILAMENTS THROUGH BICOMPONENT DRY SPINNING

GOVERNMENT LICENSE RIGHTS

This invention was made with Government support under a Collaborative Research and Development Agreement between Argonne National Laboratory and BASF Corporation (ANL Prime Contract No. W-31-109-ENG-38 under Subcontract No. ANL-85703) awarded by the Department of Energy. The Government has certain rights in this invention.

FIELD OF THE INVENTION

The present invention relates generally to superconducting materials. More specifically, the present invention relates to fibers formed from superconducting materials by multicomponent dry spinning.

BACKGROUND OF THE INVENTION

As used herein, the following terms have the meanings ascribed. "Potentially superconducting" refers to materials which are known to be superconducting under certain conditions, whether or not those conditions are prevailing at a given time.

The terms "fiber" or "fibers" refer to slender threadlike elongated structures whether in staple or filament form.

The terms "filament" or "filaments" refer to fibers of extreme or indefinite length.

The term "staple" refers to fibers of short, finite length.

The term "spinnable" refers to the property of materials that are capable of large irreversible deformations when subjected to uniaxial stress. Spinnable materials are capable of being formed into fibers.

The term "dry spinning" refers to a process for spinning fibers in which a solution of fiber-forming substance is extruded in a continuous stream to an atmosphere suitable to remove solvent thereby leaving a solid filament.

The terms "superconductor" or "superconductors" refer to materials that will conduct electricity with no loss of energy due to resistance below a certain critical transition temperature (Tc), below a certain critical current density (Jc) and in a magnetic field below a critical strength (Hc). These materials show the Meissner effect (the repulsion of magnetic fields independent of field polarity) below the critical transition temperature (Tc) and critical magnetic field strength (Hc). The critical field strength (Hc) is a function of the temperature. Field strength values are higher at lower temperatures. "High temperature superconductors" are those which have a superconducting transition temperature (Tc) above 77K (boiling point of nitrogen under atmospheric pressure).

The terms "precursor" or "precursors" refer to starting or intermediate materials in the fabrication of the superconducting materials that have not yet been processed into a material capable of superconduction. Metal oxide superconductor precursors are stoichiometric mixtures of nonsuperconducting oxides, nitrates, acetates, carbonates, or other chemical derivatives of potentially superconducting materials that are to be fired or sintered into the superconducting alloy. During firing or sintering, the undesired elements are driven off leaving a superconducting residue.

The term "bicomponent" refers to composite fibers having two distinct non-blended components.

The discovery of high temperature superconductors opened the pathway for several applications (e.g., supermagnets, generators, electrical energy storage). There are, however, many issues that need to be resolved prior to commercial use of the high temperature superconductors. For example, it is believed that, unlike malleable metals, high temperature potentially superconducting materials cannot be processed by first melting and then forming them to the desired shape, for example, wires. One important field of investigation is, therefore, how to produce potentially superconducting wires having sufficient current density and which are sufficiently insensitive to magnetic fields.

Early work along these lines involved mixing a slurry of a superconducting material into a fiber-forming material and wet-spinning the mixture to form fibers. Fibers made by this process generally lack good fiber properties since high loading of superconducting material into the fiber-forming material deteriorates spinning performance. As a result, insufficient superconductor loading resulted in poor superconducting performance, e.g., insufficient consolidation of the superconducting particles. R. B. Cass, "Fabrication of Continuous Ceramic Fiber by the Viscous Suspension Spinning Process", *Ceramic Bulletin,* Vol. 70, No. 3, 1991 describes the loading of viscose with superconducting material which is then spun.

Oxide ceramic superconducting fibers are described in Japanese Kokai Tokkyo Koho Nos. 01,122,511; 01,122,512; and 01,122,521. The fibers may be made by dispersing the superconductor or its source material in an aqueous solution of a water soluble polymer like polyvinyl alcohol; wet spinning the aqueous solution into a solution which precipitates the polymer; and heating the fibers.

Superconducting fibers based on oxide superconductors and products resulting therefrom may be prepared by extruding the superconductor in a binder. Brazilian Patent Application No. 87 03,412 discloses ceramic oxide powder in a polymer binder. The polymer is removed by heating at 100° C. and the superconductor is sintered.

Japanese Kokai Tokkyo Koho No. 01,176,606 describes a process for making oxide superconducting fiber precursors by dispersing or dissolving an oxide superconductor source material in a solution containing a polymer. The polymer is then spun to form a precursor fiber which is heated. The polymer may be polyvinyl alcohol.

Ceramic superconducting fibers of up to about 200 cm have been spun by drawing nitrate and acetate superconducting precursors in polyacrylic acid gels. Catania, Hovnanian, Cot, "Superconducting $YBa_2Cu_3O_{7-x}$ Fibers From Aqueous Acetate/PAA and Nitrate/PAA Gels", *Mat. Res. Bull.,* Vol. 25, 1990, pp. 1477–1485, describe a lengthwise orientation of the fiber particles. A wet-spinning process is described as preferable. The resulting fibers are described as having poor mechanical properties.

Goto, Sugishita and Kojima, "A New Fabrication Process of $Y_1Ba_2Cu_4O_8$ Superconducting Filament by Solution Spinning Method Under Ambient Pressure", *Physica,* C 171, 1990, pp. 441–443 describe the preparation of ceramic superconducting fibers by dry spinning superconducting precursors (yttrium, barium and copper acetates) in a polyvinyl alcohol carrier under one atmosphere oxygen pressure. The resulting fiber was considerably porous.

Goto, "Nonaqueous Suspension Spinning of High-$T_c$Ba—Y—Cu—O Superconductor", *Japanese Journal of Applied Physics,* Vol. 27, No. 4, April, 1988, pp. L680–L1682 discusses the nonaqueous suspension spinning of a superconducting ceramic oxide filament by suspending a fine powder of the oxide precursors in a polyvinyl alcohol/ dimethyl sulfoxide solution containing a dispersant. The suspension is extruded into a precipitating medium of methyl alcohol and coiled on a winding drum. The wound filament is dried and subjected to heat treatment to generate the superconductor.

European Patent Application Publication No. 0 248 432 discloses a wet-spinning process for making a ceramic green body (which may be a fiber) including contacting a superconductor precursor material slurry with a solidifying liquid. The slurry contains a ceramic powder raw material, a binder and a solvent. The binder may be nitrocellulose or cellulose acetate.

It is known to make ceramic fibers from ceramic precursor sheath/core fibers. U.S. Pat. No. 4,863,799 to Mininni et al. describes a preceramic fiber made by melt, dry or solution spinning a sheath/core fiber in which the preceramic material forms the core. Organosilicon preceramic polymers are spun as a core and certain film forming polymers are used for spinning a sheath layer. Cellulose esters of carboxylic acids, such as cellulose acetate, cellulose propionate, cellulose acetate propionate, and the like, may be used as the sheath.

U.S. Pat. No. 4,559,191 to Arons describes another process for preparing a green ceramic fiber using a sheath/core spinning technique. A green ceramic powder is formed into a dispersion or slurry and placed in the core. Suitable sheath forming polymers include cellulosic esters, among others. When the fiber is wet spun, it is extruded into a coagulation bath. The coagulation bath is any nonsolvent for the sheath forming polymer including water, methanol, propanol, ethylene glycol and the like.

There remains a need for a process to make potentially superconducting filaments having a particle density sufficient to give a usefully high current density and yet still remains manageable, e.g., non-friable.

Superconductor containing fibers have been manufactured using a bicomponent rayon process as described in U.S. patent application Ser. No. 08/198,241 now abandoned and U.S. patent application Ser. No. 08/198,936 now allowed, both assigned to BASF Corporation. One potential disadvantage of using the rayon process to make superconducting fibers is that the superconductor is exposed to several chemicals during this process. For example, the core suspension comes in contact with the viscose in the spin pack.

SUMMARY OF THE INVENTION

One aspect of the present invention is a process for dry spinning fibers which contain potentially superconducting material. The process involves preparing a suspension of potentially superconducting powder in a thickened solvent; preparing a solution of fiber-forming polymer; supplying the suspension and the solution to a spinning apparatus; in the spinning apparatus, arranging the solution and the suspension in a bicomponent arrangement; extruding the arranged solution and suspension from a spinneret as a bicomponent filament; and removing the solvent from the filament.

Another aspect of the present invention is a bicomponent fiber containing potentially superconducting materials. The fiber includes a first component of fiber-forming synthetic polymer, and a second component of potentially superconducting material dispersed substantially uniformly in a matrix. The material and the matrix form a slender elongated structure having a length at least 100 times its width.

It is an object of the present invention to provide a bicomponent spinning process for dry spinning potentially superconducting materials.

Another object of the present invention is to provide a bicomponent fiber containing potentially superconducting materials.

Related objects and advantages will be apparent to those of ordinary skill in the art after reading the following detailed description.

DESCRIPTION OF THE PREFERRED EMBODIMENTS

To promote an understanding of the principles of the present invention, descriptions of specific embodiments of the invention follow, and specific language describes the same. It will nevertheless be understood that no limitation of the scope of the invention is thereby intended, and that such alterations and further modifications, and such further applications of the principles of the invention as discussed are contemplated, as would normally occur to one ordinarily skilled in the art to which the invention pertains.

The present invention is a process for making superconductor containing fibers by dry spinning a bicomponent fiber. Fibers made by the present invention include those having a fiber-forming sheath surrounding a suspension of potentially superconducting material and other arrangements of the fiber-forming polymer with the suspension, like side-by-side fibers. Although the following description refers to sheath/core fibers to describe the process, this reference should not be limiting. Those ordinarily skilled in the art will readily understand how to adapt the process described to any desired cross-section.

Figure 1:
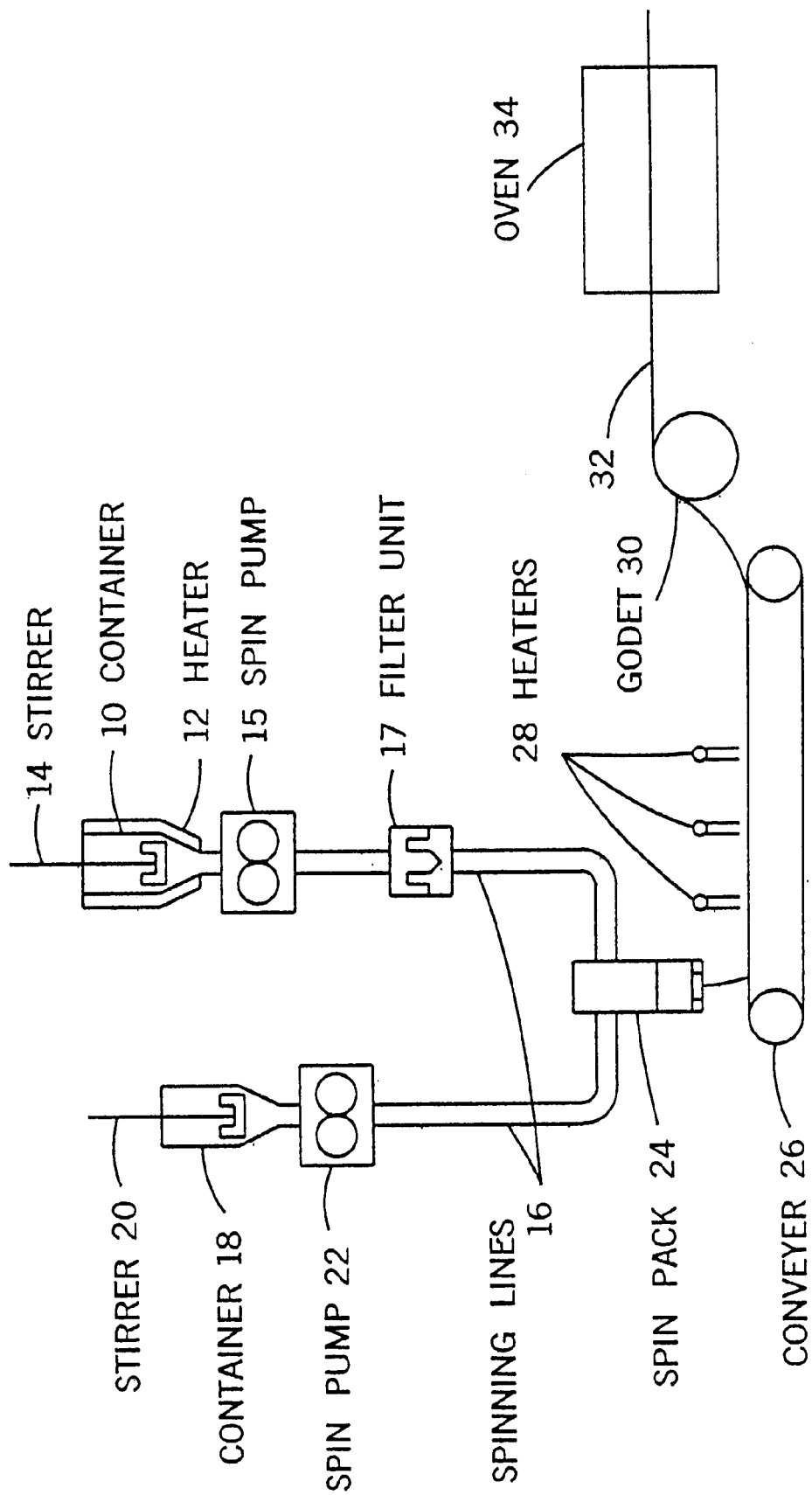
FIG. 1 is a schematic illustration of a process according to the present invention.

The manner of spinning generally follows well known techniques for bicomponent dry spinning. Such a method is illustrated schematically in FIG. 1. The core suspension (the composition of which is described more fully below) is placed into optionally agitated and optionally temperature controlled container 10. Temperature control is advantageous for substances requiring an elevated temperature to control viscosity and sometimes to prevent precipitation of the thickener. The ideal temperature can be easily determined by a minimum amount of experimentation to determine which temperature range will produce the desired viscosity or stability of the suspension. Temperature control can be obtained with, for example, heater jacket 12, which envelopes container 10. Stirrer 14 or other suitable means can be used to provide agitation. Container 10 may be pressurized up to 25 psi or a pressure suitable to provide sufficient inlet pressure to metering pump 15. Spinning lines 16 can optionally be heated to reduce the viscosity and possibly to accelerate evaporation of the solvent at the exit of the spinneret.

The suspension may be filtered through filter unit 17. Filter unit 17 may be a sintered metal candle filter or any other filter suitable for the purpose.

The fiber-forming sheath material, typically a dissolved polymer, is placed into optionally agitated and optionally heated container 18. Optional stirring may be accomplished with stirrer 20 or other suitable means. Container 18 may be pressurized up to 25 psi or any pressure suitable to provide sufficient inlet pressure to spin pump 22. Spin pump 22 supplies the polymer solution to spin pack 24. The suspension and polymer solution are arranged in bicomponent fashion and extruded through spin pack 24. Useful spinning pressures include those between 90 and 3000 psig. Spin pack 24 may be constructed according to thin plate technology as described in U.S. Pat. No. 5,162,074, incorporated herein by reference. Spin pack 24 is in a close proximity to conveyer belt 26. The distance between spin pack 24 and conveyor belt 26 can be adjusted to avoid fluctuations of the filament caused by air turbulence. Denier can be adjusted by changing throughput and/or conveyor belt speed.

Filament drawing can be accomplished by increasing the speed of conveyer belt 26. The spinning solvent may be removed by ordinary methods known in the art such as convection (with or without supplemental heat) and radiation. Solvent evaporation begins when the filaments exit the spinneret and continues until the filaments are substantially solvent free. Conveyer belt 26 is optionally equipped with fan heaters 28 blowing into a tube surrounding the fiber to aid the removal of the solvent. More solvent may be removed on the belt conveyer by blowing air in a countercurrent flow pattern.

At the end of conveyer belt 26, the fiber should be solidified enough to be transported by godet 30. The belt surface should be selected to minimize sticking since some of the polymers, for example, those containing polyvinylpyrrolidone tend to be "tacky", depending on the residual solvent content. One especially preferred belt surface is tetrafluoroethylene. The smoothness of the surface should be optimized to reduce the tendency of the fiber to stick. Glassy surfaces promote sticking but surfaces that are too rough promote disfigurement of the fibers.

Dried filament 32 may be transported by godet 30 to oven 34. In oven 34, residual spinning solvent is removed. A typical approximate oven temperature is 200° C. but, of course, the temperature used will depend on the solvent and other conditions present.

Figure 2:
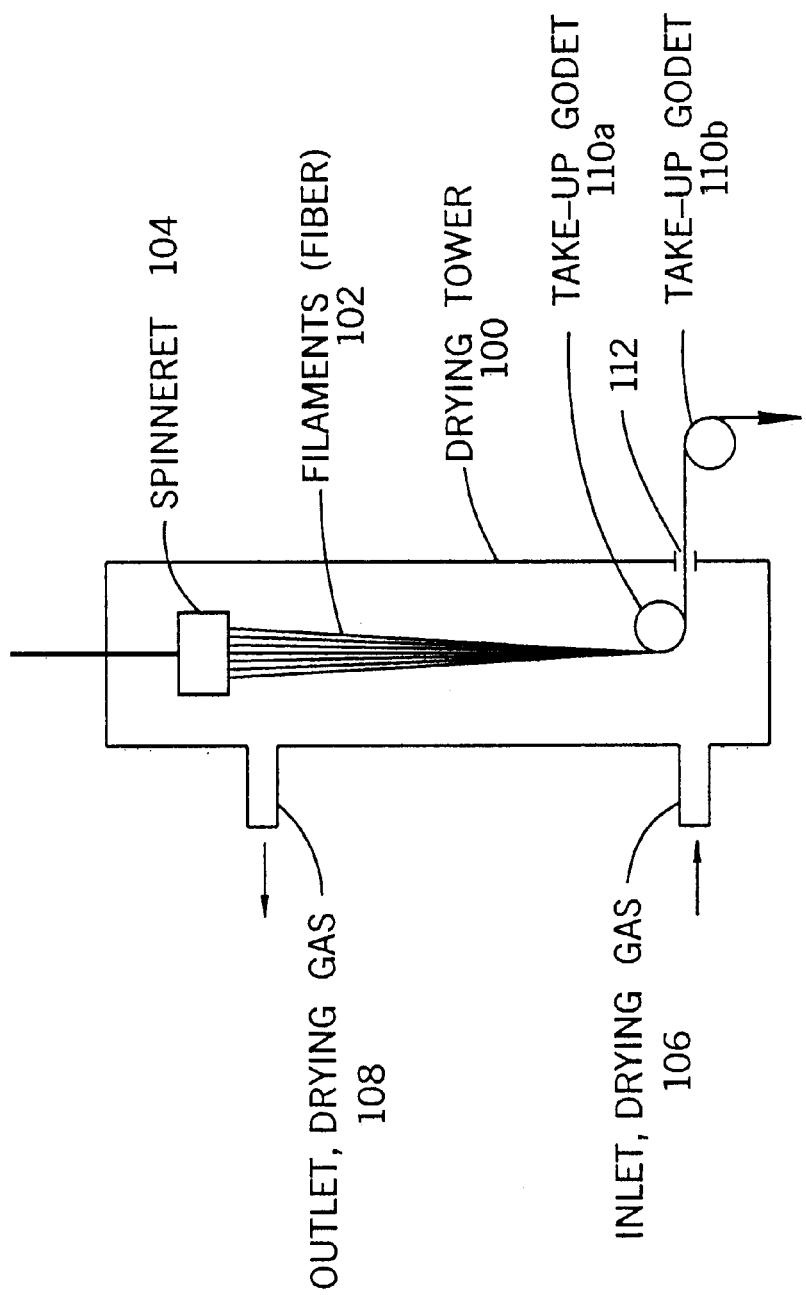
FIG. 2 is a schematic illustration of an alternate embodiment of the invention shown in FIG. 1.

In an alternate procedure, the filaments may be spun into a heated tube. Such a tube is shown in FIG. 2. Drying tower 100 is about 4 to 8 meters long and 150–300 mm in diameter. Filaments 102 are extruded from spinneret 104 into heated tube 100. Heated drying gas is provided in a countercurrent flow (relative to the extrusion direction) through gas inlet 106 and to gas exhaust 108. A quench screen (not shown) may be used to provide a sufficient quantity of low velocity air without turbulence. Take-up godets 110a and 110b assist in collecting and directing filaments 102 to further processing such as treatment in an oven (not shown in FIG. 2). Collected filaments 102 exit drying tower via orifice 112 with substantially all solvent removed. The temperature of the gas varies according to the solvent used. Other drying methods are also known, for example, drying could be accomplished in a discontinuous process.

Figure 3:
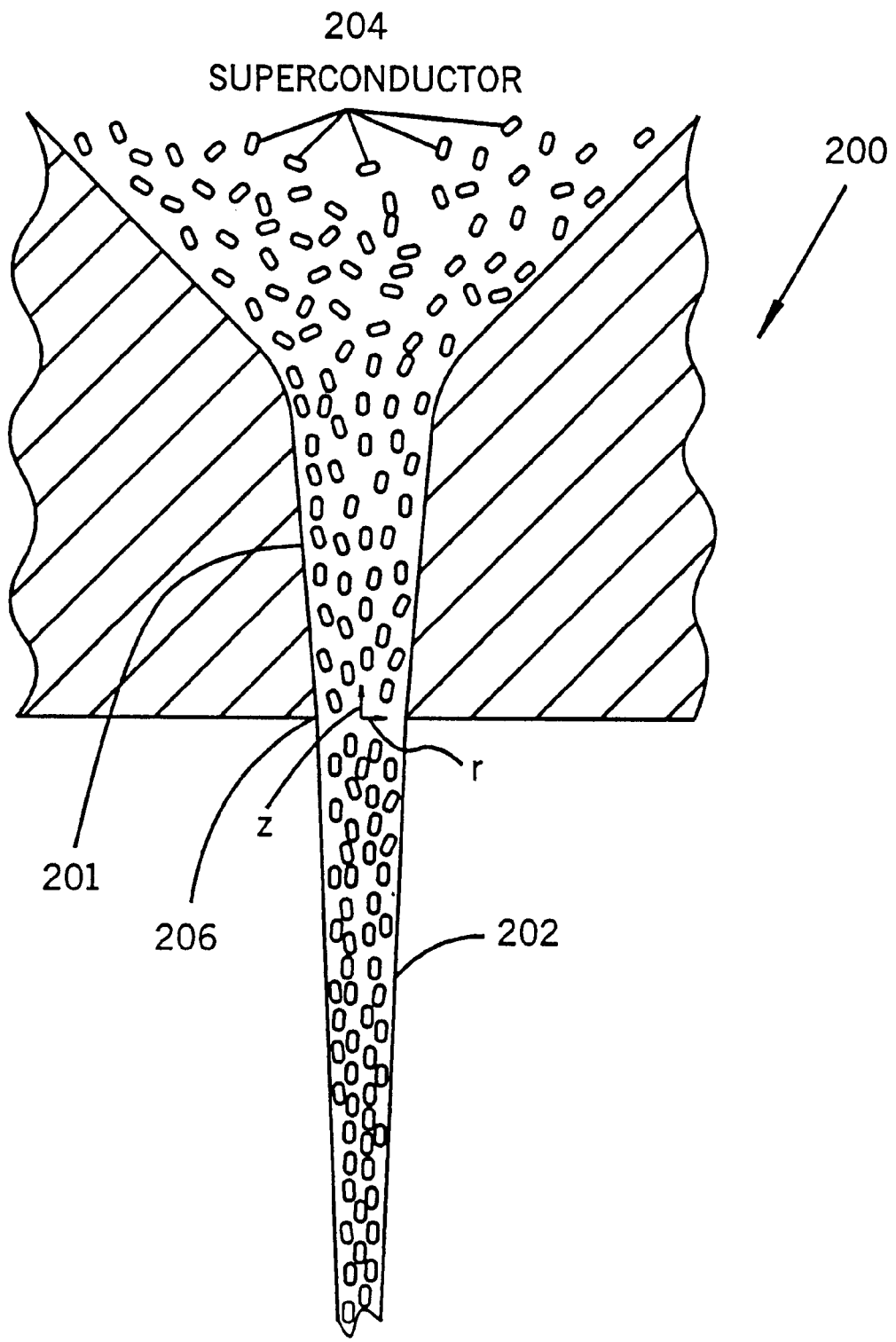
FIG. 3 is a partial cross-sectional view of a spinneret designed to align particles passing through it.

Particle Alignment:

Certain types of superconducting particles are anisotropic in regard to electrical conductivity. $YBa_2Cu_3O_7$ is an example of one such superconductor. This means that particles with length to diameter ratios above 1 can be aligned along a favorable axis to improve the current density. The first alignment may occur during the spinning. It is possible to start the alignment of the particles in the spinneret capillary and continue the alignment during the primary stretching. FIG. 3 schematically illustrates a shape of the capillary useful to align particles extruded. The shape approaches hyperbolic.

Additional alignment of the particles can be achieved during drawing. Further alignment is possible by introducing a relatively high magnetic field after spinning. Because of the anisotropic magnetic character of the particles, no aspect ratio is needed to do so. The magnetic alignment can be performed in-line or shortly after spinning. In order to minimize alignment resistance, the viscosity of the solution should not be allowed to increase excessively.

Flow in the Spinneret Capillary:

Alignment in the spinneret capillary depends on the capillary geometry and the resulting flow profiles. The capillary shape should be approximately hyperbolic. The optimum shape may be determined as follows. Flow can be regarded as a two-dimensional flow. The corresponding cylinder coordinates (r, z) are depicted in FIG. 3.

FIG. 3 is a partial cross-sectional view of spinneret 200 showing capillary 201. Spinneret orifice 206 is designed to maximize particle alignment in extruded filament 202. Potentially superconducting particles 204 are shown with no alignment toward the backhole and with increasing alignment toward extrusion orifice 206.

The velocity profile of the capillary v(r,z) can be derived using the Navier-Stokes equation. After several simplifying assumptions, the equation balances pressure drop and flow resistance. Because of space constraints, the derivation of the equation and the assumptions made are not presented here. Cogswell showed that the maximum velocity gradient for a conical die in the z direction is:

$$(\partial v / \partial z)_{max} = \frac{\tan\theta}{2} \frac{3n+1}{n+1} \frac{4Q}{\pi R^3}$$

$\partial v / \partial z$  strain rate (velocity gradient in $z$ direction)

$v$  velocity $\theta$  angle between the vertical and the capillary wall (the half-cone angle)

$n$  power law coefficient $\tau$  shear stress $Q$  volumetric flow rate $R$  radius of capillary at exit($z = 0$)

Cogswell, J. H., *Polymi Eng. Sci.,* 12, 64 (1972).

G. Y. Chen, J. A. Cucula and P. A. Tucker, *J. Polymer Sci., Part B: Polym. Phys.,* 30, 557 (1992) derived an expression for the coordinates of a die profile (a hyperbolic die) for which the velocity gradient is a maximum at every value of z. Assuming that the angle at the maximum radius of the profile (z=L) is 45°, Chen, Cucula and Tucker find that:

$$r=(Az+R^{-2})^{-\frac{1}{2}}$$

where R=radius of the capillary at the exit (at z=0) or above $$A = \frac{K\pi}{2QN} = \frac{-2\tan\Theta_o}{R^3}$$

$$N = \frac{(3n+1)}{2(n+1)}$$

$Q$ = volumetric flow rate $K = (dv/dg)_{max}$ $n$ = the power law coefficient

-continued $\Theta_o$ = angle between the vertical and the capillary wall(the half-cone angle)at the nozzle exit, or simply, the exit angle The Suspension:

Several suspensions are useful as the core material in the present process for dry spinning. The suspension consists generally of four main elements: the superconductor, the thickener, the solvent and the dispersant. These four elements are not considered limiting and additional elements may be present or one element may function as two. In addition, the suspension preferably has a viscosity greater than 3,000 mPa·sec at 120 (1/min) shear rate; good visual uniformity; stability for more than about 5 hours; and the absence of bubbles. One manner of removing bubbles is to permit the suspension to stand for several hours to allow the bubbles to rise. Alternatively, a vacuum may be applied to speed bubble removal. Other methods may also be used in accordance with the knowledge of those who are ordinarily skilled.

The uniformity and stability of a suspension is dependent on several parameters. Sedimentation velocity has a significant affect on the stability of a suspension. Another important phenomenon is the agglomeration of the particles in the suspension. Agglomerates may plug (either partially or totally) one or more spinneret holes (or other process equipment, e.g., a film extruder), thereby decreasing the processability of the fiber and the effective run time. The superconducting particles should be uniformly distributed throughout the suspension. Agglomeration may be inhibited by decreasing the attractive forces among the superconducting particles.

Even though particle agglomeration is undesired, if the mutual repulsion of the particles is too high, suspension viscosity may be insufficient. Sufficient viscosity is a prerequisite for a low sedimentation speed. The viscosity is generally dependent on the following parameters: pressure; temperature; shear rate (for non-Newtonian fluids); solids content (concentration); and time (flocculation, slow reaction).

The viscosity of the suspension should be such that spinning is practical. Presently, the preferred viscosity limits are 3,000–800,000 mPa·sec at room temperature (20° C.).

Surface tension is also an important parameter of suitable solutions and suspensions for use in the present invention. Surface tension characterizes the intermolecular attraction in the solution or suspension and describes the surface force at the exit of the spinneret. Surface tension of a solution is dependent on the surface tension of the solvent and the thickener content. The surface tension increases with increasing thickener content, indicating the increase in the intermolecular attraction.

The stability of the suspension may be characterized by measuring the viscosity, surface tension, and pH at certain intervals. A criterion for a sufficiently stable solution or suspension has been established. In general, a change of 25% of the initial value of any measured characteristic is considered a signal of instability at the time the observed change occurs. All suspensions should be adequately stable (change less than 25%) for least 5 hours.

The suspension-containing potentially superconductive powder is made in several steps and involves the several substances described. Although a variety of methods may be used to make a suitable suspension, one is particularly preferred: First, the dispersant, if used, is mixed into the solvent. Then the thickener is added to the mixture. The polymer should be completely dissolved. Complete dissolution may be achieved by heating a portion of the solvent sufficiently to enhance dissolution before the addition of the polymer but it is not essential to heat the solvent. The remainder of the solvent is added after the polymer solution has cooled down to room temperature. The viscosity, pH and surface tension of this liquid should be maintained within predetermined limits that vary according to the materials used. Ranges for other combinations are readily determined according to the desired end use and superconductor. Finally, the superconductor is added. Advantageously, the suspension is maintained in a sealed environment at all times to prevent evaporation.

The Superconductor:

A large variety of potentially superconducting materials are useful in the present invention. The superconductor may be ceramic or non-ceramic. Exemplary ceramic superconductors include $(LaBa)_2$; $CuO_4$, $YBa_2Cu_3O_7$; $Tl_2Ba_2Ca_2Cu_3O_{10}$; $Bi_2Sr_2CaCu_2O_8$; $La_{1.85}Sr_{0.15}CuO_4$; $HgBa_2CuO_4$; $HgBa_2Ca_2Cu_3O_8$; $B_{1.8}Pb_{0.4}Sr_{2.0}Ca_{2.2}Cu_{3.0}O_{10.6}$; $HgBaSrCa_2Cu_3O_8$; and doped fullerenes as well as many other ceramic superconductors. Exemplary non-ceramic superconductors include NbC; $V_3Si$; $Nb_3Gr$; $Nb_3AL_{0.75}Gr_{0.25}Nb_3S_n$; NbTi alloys; NbTiZr alloys; NBTiTa alloys; $V_3Ga$; lead; and mercury. Presently, the preferred superconductor is yttrium-barium-copper-oxide ($YBa_2Cu_3O_{7-x}$) wherein x is less than 0.4 and, more preferably, less than 0.1.

Preferably, the superconductor is loaded into the suspension at as high an amount as practical. Superconductor loading is preferably at least about 20 weight percent of the suspension. The presently most preferred loading is at least 60 weight percent of the suspension. Even higher loading is envisioned. The ratio of potentially superconducting material to total material (superconducting and non-superconducting) in the suspension preferably will result in a green state fiber (with solvent removed) having at least 50 weight percent but more preferably exceeding 75 weight percent potentially superconducting material in the green fiber state.

The crystal structure of the superconducting powder may be a factor in obtaining a suitable dispersion. Preferably, the $YBa_2Cu_3O_{7-x}$ powder is a single crystal variety but the preferable form may depend on the superconductor used. If the particles are too large for spinning or other processing, they may be milled using a ball mill or other suitable mill and milling may be optionally followed by filtering through a screen to remove large particles. In general, the average particle size is preferably about 5 microns and, more preferably, 2–4 microns. Of course, the size may vary according to the size of the spinning orifice or the intended end use.

Large aspect ratios are preferred since they favor alignment of the particles in the superconducting direction during spinning. Currently the most preferable aspect ratio is at least 1.5.

The Thickener:

The thickener and fiber-forming polymer used for the sheath material may be the same material or different. Polyvinylpyrrolidone (polyvinylpyrrolidone) is useful as a thickener for the present bicomponent dry spinning process. It is preferred because of its low ash content (less than 0.02%) and because it does not melt. Additionally, polyvinylpyrrolidone is available at high molecular weights (up to about 1,200,000) and dissolves well in many solvents. Also, polyvinylpyrrolidone is relatively inert to changes in pH.

The synthesis of polyvinylpyrrolidone is well known. It is presently commercially available from GAF Chemicals Corporation, Wayne, N.J., and BASF AG, Ludwigshafen, Germany.

Other useful thickeners include polyethyleneoxide, polyacrylamide and ethyl cellulose.

Solvent:

A variety of solvents may be used. When polyvinylpyrrolidone is the polymer, water, ethanol, n-butanol and electrolyte solutions like ISOTON II® sold by Coulter Diagnostics, Hialeah, Fla. (NaCl 7.93 g/L; Disodium EDTA 0.38 g/L; KCL 0.40 g/L; $NaH_2PO_4$ 0.19 g/L; $NA_2HPO_4$ 1.95 g/L, NaF 0.3 g/L) and a variety of organic solvents are some of the solvents that may be used. The lower aliphatic alcohols (up to $C_{10}$) are presently preferred because they provide an inert environment for the superconductor.

Dispersant:

A dispersant decreases attraction between the superconductor particles. Suitable dispersants include lower aliphatic alcohols like 2-propanol, inorganic electrolytes and surfactants. 2-propanol or inorganic electrolytes are especially useful when water is the solvent.

In some cases, the solvent may also act as dispersant and so additional dispersing agents are not necessary. An amount of dispersant suitable to prevent agglomeration of the superconducting particles without desolubilizing the polymer should be used.

The Fiber-Forming Material:

Useful sheath materials include any polymer solution useful for dry spinning. These include cellulose solutions such as cellulose acetate and cellulose triacetete solutions; and other solutions such as polyacrylonitrile, modacryl, polyvinylalcohol, polyvinylchloride and aromatic polyamide solutions. Presently, the preferred sheath material is a solution of polyvinylpyrrolidone in ethanol. Preferably the polyvinylpyrrolidone loading is 15 to 50 grams per 100 grams of solvent. While the preferred solvent is ethanol, any solvent useful for the fiber-forming polymer can be used.

The core suspensions and sheath solutions are easily extruded from a spinneret hole according to the process described above. Even at a relatively low polymer content the threadline holds its integrity and does not form droplets. Air bubbles in the sheath and core materials should be avoided, however, because if air bubbles exit the spinneret hole along with the suspension, the threadline may lose its integrity.

The green fiber with solvent removed is ready for firing and can be characterized with regard to various properties, such as mechanical strength, density, superconductor distribution, etc. Another important characteristic of the green fiber is the amount of residue left after burning. Some materials, such as polyvinylpyrrolidone, leave almost no residue on burning. Residue on burning is determined in a standard procedure for measuring ash content after a defined heat treatment. In this method, a known weight of sample is heated in a suitable crucible until the carbonaceous material is gone. Then after 10 minutes in an 800° C. muffle furnace. After cooling, the crucible is weighed and the amount of residue is calculated as a percentage of the original sample. By this method, residue on burning of polyvinylpyrrolidone polymer was only 0.01%.

The green fiber is then fired to remove the non-superconducting components and to restore the stoichiometry of the superconductor. The firing conditions (time, temperature, atmosphere) will depend on the superconductor used. For $YBa_2Cu_3O_7$ superconductors, the firing may be for 12 hours at 900° C. in 100% $O_2$.

The green fiber properties can be enhanced by cross-linking the polymer. After cross-linking, some polymers, such as polyvinylpyrrolidone, are no longer soluble in water or lower alcohols. The physical properties (i.e., tensile properties) may also be influenced by the cross-linking. The degree of cross-linking is dependent on the temperature, the time and the environment (nitrogen, oxygen, air, etc.). In general, for polyvinylpyrrolidone, cross-linking starts at 150° C. The polyvinylpyrrolidone polymer can be fully cross-linked in 60 minutes at 180° C. Shorter times are possible at higher temperatures. At temperatures above 210° C., polymer degradation begins. Green fiber of potentially superconducting material (about 55 weight percent superconductor) were cross-linked in 20 minutes at 210° C. The resulting green fiber did not dissolve in water and maintained its integrity for weeks.

In the following examples, pH, surface tension and viscosity were measured with the following instruments:

TABLE 1

| Measurement | Instrument |
| --- | --- |
| pH | Accumet H meter 910 form Fisher Scientific with an Ag/AgCl 91–96 orion probe |
| surface tension | Tensiomat Model 21 from Fisher Scientific |
| viscosity | a) Brookfield Concentric Viscometer, Model VT from Brookfield Engineering Laboratories, Inc. |
| | b) Gottfert Rheograph 2002 (for higher viscosity materials) |

The invention will be described by reference to the following detailed examples. The examples are set forth by way of illustration and are not intended to limit the scope of the invention.

EXAMPLE 75 grams of polyvinylpyrrolidone (PVP) is dissolved in 150 grams of ethanol in a 600 ml beaker using a dispersator. The beaker is sealed and allowed to stand overnight. In another beaker, 75 grams of PVP is combined with 150 grams of ethanol. After the PVP has dissolved, 225 grams of $YBa_2Cu_3O_x$ superconductor powder and dispersed with a dispersator. The powder is sieved through a 60 mesh sieve before being dispersed. Both the PVP/ethanol and the PVP/powder/ethanol dispersions are poured into their respective holding tanks of a bicomponent spinning apparatus and allowed to degas overnight. From the holding tanks, each material is pumped to its respective inlet port of a 6-hole bicomponent spinning pack using two 0.16 $cm^3$/revolution gear pumps turning at 6.8 RPM. Sheath and core line pressures downstream of the pumps are 725 and 700–1000 psi (49 and 48 to 68 bar) respectively. The bicomponent pack contained four Mott 10 sintered metal filters. The spinneret capillary diameter is 0.2 mm and the length is 1.6 mm. After exiting the capillaries, the fibers are discharged onto a 3 meter long belt moving at 0.7 m/min through a 10 cm. diameter tube 2 meters in length. The fiber is dried with hot air from four 600 watt heating guns. The fiber is removed from the belt and is wound on a spindle of a winder.

What is claimed is:

1. A process for dry spinning filaments which contain potentially superconducting material, the process comprising:

preparing a suspension of potentially superconducting powder, particles of which have a length to diameter ratio above 1, in a thickened solvent;

preparing a solution of fiber-forming polymer;

supplying the suspension and the solution to a spinning apparatus;

in the spinning apparatus, arranging the solution and the suspension in a bicomponent arrangement;

extruding the arranged solution and suspension from a spinneret as bicomponent filaments;

in the spinning apparatus and prior to said extruding, forcing the suspension through a hyperbolic spinning capillary thereby mechanically aligning particles of the potentially superconducting powder along an axis of electrical conduction; and removing the solvent from the bicomponent filaments.

2. The process of claim 1 wherein said preparing a suspension is of potentially superconducting powder in ethanol thickened with polyvinylpyrrolidone.

3. The process of claim 2 wherein said preparing a suspension is of $YBa_2Cu_3O_{7-x}$, where x is less than 0.4, in a 33.3 weight percent solution of polyvinylpyrrolidone in ethanol.

4. The process of claim 2 wherein said preparing a solution is of a solution of polyvinylpyrrolidone in ethanol.

5. The process of claim 2 wherein said arranging is of the solution as a sheath around a core of the suspension.

6. The process of claim 1 wherein said preparing a solution is of a solution of polyvinylpyrrolidone in ethanol.

7. The process of claim 6 wherein said arranging is of the solution as a sheath around a core of the suspension.

8. The process of claim 1 wherein said arranging is of the solution as a sheath around a core of the suspension.

9. The process of claim 1 wherein said removing includes exposing the bicomponent filaments to hot dry air as the bicomponent filaments advance on a conveyor belt.

10. The process of claim 1 wherein said removing includes exposing the bicomponent filaments to hot dry air as the bicomponent filaments advance through a drying tower.

* * * * *

UNITED STATES PATENT AND TRADEMARK OFFICE
CERTIFICATE OF CORRECTION

PATENT NO.    : 6,248,696 B1                              Page 1 of 1
DATED         : June 19, 2001
INVENTOR(S)   : Olli P. Tuominen; Carol W. Morgan; Dominick A. Burlone; Keith V. Blankenship It is certified that error appears in the above-identified patent and that said Letters Patent is hereby corrected as shown below:

Please delete the existing title and replace it with the title as amended on August 30, 1995:

-- FORMING SUPERCONDUCTING FILAMENTS THROUGH BICOMPONENT DRY SPINNING --.

Signed and Sealed this

Fifteenth Day of January, 2002

*Attest:*

JAMES E. ROGAN
*Attesting Officer*     *Director of the United States Patent and Trademark Office*